United States Patent [19]
Adler

[11] Patent Number: 5,014,102
[45] Date of Patent: May 7, 1991

[54] MOSFET-GATED BIPOLAR TRANSISTORS AND THYRISTORS WITH BOTH TURN-ON AND TURN-OFF CAPABILITY HAVING SINGLE-POLARITY GATE INPUT SIGNAL

[75] Inventor: Michael S. Adler, Schenectady, N.Y.

[73] Assignee: General Electric Company, Schenectady, N.Y.

[21] Appl. No.: 364,294

[22] Filed: Apr. 1, 1982

[51] Int. Cl.$^5$ .................... H01L 29/10; H01L 29/74; H01L 27/02; H03K 3/26
[52] U.S. Cl. .................................. 357/38; 357/23.4; 357/43; 357/86
[58] Field of Search ............... 357/23, 38, 86, 43; 307/303

[56] References Cited

U.S. PATENT DOCUMENTS

| | | | |
|---|---|---|---|
| 3,636,372 | 1/1972 | Hujita et al. | 307/303 |
| 4,066,917 | 1/1978 | Compton | 357/43 |
| 4,199,774 | 4/1980 | Plummer | 357/38 |
| 4,356,416 | 10/1982 | Weischedel | 307/270 |
| 4,547,791 | 10/1985 | Roger et al. | 357/43 |
| 4,604,535 | 8/1986 | Sasayama et al. | 357/43 |

FOREIGN PATENT DOCUMENTS

| | | |
|---|---|---|
| 1145060 | 4/1983 | Canada . |
| 0028797 | 6/1981 | European Pat. Off. . |
| 2945366 | 5/1981 | Fed. Rep. of Germany .... 357/38 T |
| 53-87187 | 8/1978 | Japan .................... 357/43 |
| 2097585 | 11/1982 | United Kingdom . |

OTHER PUBLICATIONS

J. Plummer et al., "Insulated-Gate Planar Thyristors: I-Structure and Basic Operation", IEEE Trans, on Elec. Dev., vol. ED-27, #2, Feb. 1980, pp. 380-387.
N. Zommer, "Monolithic H. V. B1P MOS", 1981, IEEE International Electron Devices Meeting, Dec. 7-9, 1981, pp. 263-266.
B. Jayant Baliga, "MOS Gated Thyristor", Silicon Integrated Circuits-Part B, edited by D. Kahng, New York: Academic Press (1981), pp. 265-267.
J. F. Gibbons, "Ion Implantation in Semiconductors-Part I: Range Distribution Theory and Experiments", Proc. IEEE, vol. 56, No. 3 (Mar. 1968), pp. 295-319.
J. F. Gibbons, "Ion Implantation in Semiconductors-Part II: Damage Production and Annealing", Proc. IEEE, vol. 60, No. 9 (Sep. 1972), pp. 1062-1096.

Primary Examiner—Rolf Hille
Assistant Examiner—Wael Fahmy
Attorney, Agent, or Firm—Marvin Snyder; James C. Davis, Jr.

[57] ABSTRACT

MOSFET-gated bipolar transistor and thyristor integrated devices combining, as the respective turn-on and turn-off control devices, an enhancement mode MOSFET and a depletion mode MOSFET. The gates of the two MOSFETs are connected to a single device gate terminal. The conduction channel of the depletion mode MOSFET is preferably an implanted region. With gate voltage of appropriate polarity applied, the depletion mode MOSFET is non-conducting and the enhancement mode MOSFET is conducting, biasing the included bipolar transistor or thyristor into conduction. With zero gate voltage applied, the depletion mode MOSFET conducts and the enhancement mode MOSFET is non-conducting, turning off the included bipolar transistor or thyristor. Significantly, only a single polarity gate input signal is required.

14 Claims, 5 Drawing Sheets

MOSFET-GATED BIPOLAR TRANSISTORS AND THYRISTORS WITH BOTH TURN-ON AND TURN-OFF CAPABILITY HAVING SINGLE-POLARITY GATE INPUT SIGNAL

BACKGROUND OF THE INVENTION

The present invention relates to MOSFET-gated bipolar transistors and thyristors having both turn-on and turn-off capabilities.

Hybrid forms of semiconductor devices have previously been proposed, and some have been commercially produced, which combine, in a single integrated device, a MOSFET input stage with junction bipolar device output stage. Such hybrid devices beneficially combine the high input impedance characteristic of MOSFET devices with power-handling capabilities of bipolar devices.

The term "MOSFET", although an acronym for "Metal-Oxide-Semiconductor Field-Effect Transistor", is employed herein in a broader sense to include various equivalent forms of devices, well known to those skilled in the art. For example, the conductive gate electrode may actually be metal such as aluminum, as is shown in the drawings figures herein, but may as well comprise any suitably-conductive material such as highly-doped polycrystalline silicon of either N+ or P+ conductivity type. Similarly, the gate insulating layer may actually be an oxide, such as silicon dioxide, but may as well comprise another insulating material, such as silicon nitride, or even an oxide/nitride sandwich.

Particularly relevant in the context of the present invention is a MOSFET-gated bipolar transistor, such as is for example disclosed in a paper by Nathan Zommer entitled "Monolithic H.V. BIP MOS", 1981 IEEE International Electron Devices Meeting, pp. 263-265, Dec. 7-9, 1981. As there disclosed, this previous MOSFET-gated bipolar transistor device combines, in a single integrated device, the collector, base and emitter electrode regions of a bipolar transistor with an enhancement-mode MOSFET having its drain and source electrodes connected between the collector and base of the bipolar transistor. When an appropriate gate input signal is applied to the MOSFET, its channel conducts, in turn biasing the bipolar transistor into conduction. However, the integrated structure of this particular prior art device does not include any reliable means for turning off the bipolar transistor, necessitating external devices to provide the turn-off function.

Another form of prior art device particularly relevant in the context of the present invention is a hybrid form of thyristor suggested in commonly-assigned Temple U.S. patent application Ser. No. 331,049, filed Dec. 16, 1981 entitled "SEMICONDUCTOR DEVICE WITH IMPROVED TURN-OFF CAPABILITY". This particular hybrid device includes a four-layer thyristor structure combined with a pair of MOSFET devices in the same integrated structure. Specifically disclosed is a P-channel enhancement mode MOSFET appropriately combined in the integrated structure with the thyristor portion of the device to, when conducting, form a short between the gate and cathode electrode regions of the thyristor device to turn it off. Suggested is an N-channel enhancement mode MOSFET appropriately arranged to bias the thyristor portion of the integrated device into conduction when the N-channel enhancement mode MOSFET is biased into conduction. The gates of the two MOSFETs can be electrically connected together to provide a single gate input terminal. The effect of the single gate input terminal is to turn on the thyristor device when a positive gate voltage is applied, and turn off the thyristor device when a negative gate voltage is applied.

Relevant also in this context is a discussion by B. Jayant Baliga entitled "MOS Gated Thyristor" in Silicon Integrated Circuits—Part B, edited by Dawon Kahng, pp. 265-267, Academic Press (1981). This Baliga article discloses an integrated device structure including a VMOS device for triggering a four-layer thyristor into conduction, and points out that both enhancement and depletion mode devices can be fabricated.

While the above-summarized Temple device is potentially quite useful, its requirement for opposite-polarity gate input voltages for turn on and turn off is somewhat disadvantageous when the device is incorporated in actual circuits. In particular, the requirement for a positive gate voltage to bias the N-channel enhancement mode MOSFET into conduction for turning on the thyristor device presents no inconvenience. However, it is less convenient, in many actual circuits, to provide a negative gate voltage to bias the P-channel enhancement mode MOSFET into conduction for turning off the thyristor device.

By the present invention there are provided three-terminal MOSFET-gated bipolar transistor and thyristor devices characterized by having both turn-on and turn-off capability with a single-polarity input signal which, in the preferred embodiments, is of the same polarity as operating supply voltage to the device when connected in circuit.

SUMMARY OF THE INVENTION

Accordingly, it is an object of the invention to provide a MOSFET-gated bipolar transistor or thyristor integrated structure having both turn-on and turn-off capabilities, and to provide these capabilities with a single polarity input signal.

Briefly, and in accordance with an overall concept of the invention, it is recognized that such devices can be achieved through a combination, as the turn-on and turn-off control devices, of an enhancement mode MOSFET and a depletion mode MOSFET, respectively, in a single integrated structure with a bipolar transistor or thyristor. Significantly, the depletion mode MOSFET conducts with zero gate voltage, and the main terminals (source and drain) of the depletion mode MOSFET can accordingly be employed to turn off the included bipolar transistor or thyristor in the absence of gate input voltage. For example, this may be accomplished in the case of a bipolar transistor by connecting the source and drain terminals of the depletion mode MOSFET between the base and emitter electrodes of the bipolar transistor.

In contrast to the prior art MOSFET-gated thyristor summarized above, in specific embodiments of the present invention the P-channel MOSFET for turning off the thyristor (or bipolar transistor) is of the depletion mode type, rather than of the enhancement mode type. The channel of a depletion mode P-channel MOSFET conducts with zero gate voltage, and becomes non-conducting with sufficient positive gate voltage.

Advantageously, the devices of the present invention can be readily fabricated using known fabrication processes, quite similar to the fabrication processes for the various prior art devices referred to hereinabove. Nevertheless, despite the relative ease of fabricating, prior to the present invention, these principles have gone unrecognized.

Briefly, and in accordance with a more particular aspect of the invention, there is provided a MOSFET-gated bipolar transistor integrated device having single input polarity turn-on and turn-off control and comprising a bipolar transistor including a semiconductor base region layer between semiconductor emitter and collector region layers. The emitter and collector region layers are of one conductivity type, for example N conductivity type, and the base region layer of opposite conductivity type, for example P conductivity type. There is also included a MOSFET of one mode type, preferably an enhancement mode MOSFET which is non-conducting with zero gate voltage and conducting when gate voltage of proper polarity is applied. This MOSFET of one mode type has a gate electrode and a pair of main electrodes connected between the base and collector region layers for biasing the bipolar transistor into conduction when the MOSFET of the one mode type is conducting. There is also included a MOSFET of opposite mode type. In the preferred embodiment this is a depletion mode MOSFET which is conducting with zero gate voltage and non-conducting when gate voltage of the proper polarity is applied. The MOSFET of opposite mode type has a gate electrode and a pair of main electrodes connected between the base and emitter region layers for turning off the bipolar transistor when the MOSFET of the opposite mode type is conducting. For the case discussed above of an NPN bipolar transistor, the enhancement mode MOSFET has a conductive channel of N conductivity type. The depletion mode MOSFET has a channel of the opposite conductivity type, which in this example is P conductivity type.

Advantageously, there is an electrical connection between the gate electrodes of the two MOSFETs, providing a common gate electrode terminal. The overall device, then, is a triode or three-terminal device.

In accordance with the invention, there is also provided a corresponding MOSFET-gated thyristor integrated device. The thyristor integrated device includes a four-layer semiconductor switching device including, in order, an anode region layer of P conductivity type, a first base region layer of N conductivity type, a second base region of P conductivity type, and cathode region layer of N conductivity type. Again, two MOSFETs are provided. The first of these is an enhancement mode MOSFET having a gate electrode and a pair of main electrodes connected between the first base region cathode and region layers for biasing the switching device into conduction when the enhancement mode MOSFET is conducting. The other of these is a depletion mode MOSFET having a gate electrode and a pair of main electrodes connected between the second base and the cathode region layers for turning off the switching device when the depletion mode MOSFET is conducting. As in the bipolar transistor embodiment, preferably the enhancement mode MOSFET has a channel of N conductivity type, and the depletion mode MOSFET has a channel of P conductivity type. Advantageously, there is an electrical connection between the MOSFET gate electrodes, resulting in a three-terminal MOSFET-gated thyristor integrated device.

In accordance with another aspect of the invention, a specific structure for a MOSFET-gated bipolar transistor integrated device is provided. The bipolar transistor has a semiconductor substrate including a collector region of one conductivity type and having a principal surface. A base region of opposite conductivity type is formed within the collector region such that at least a portion of the interface between the base and collector regions forms the collector/base junction of the bipolar transistor. The base region is of limited lateral extent, and has a periphery terminating at the principal surface. The base region layer preferably is formed by means of conventional diffusion techniques. The device also includes an emitter region of the one conductivity type, for example N conductivity type, formed, preferably by diffusion, within the base region such that at least a portion of the interface between the emitter and base regions forms the emitter/base junction of the bipolar transistor. The emitter region is of limited lateral extent, and has a periphery terminating at the principal surface.

To provide a MOSFET source terminal, a first termination region of the one conductivity type, for example N conductivity type, is formed within the base region. This first termination region extends to the principal surface and is spaced from the collector region such that at the principal surface a portion of the base region exists as a band of opposite conductivity types between the first termination region and the collector region. In order to complete the structure of an enhancement mode MOSFET, a first MOSFET gate insulating layer is disposed on the principal surface over at least a portion of the band, and a first MOSFET conductive gate electrode is disposed on the first MOSFET gate insulating layer at least laterally over a portion of the first band. The first MOSFET device thus defined is of the enhancement mode type and is arranged to establish a channel of the one conductivity type extending between the collector region and the first termination region. To complete the portion of the device structure directly associated with the first MOSFET, there is an ohmic electrical connection between the first termination region and the base region such that the channel of the first MOSFET device, when conducting, electrically connects the bipolar transistor collector and base regions for biasing the bipolar transistor into conduction.

In order to provide a drain electrode region for a second MOSFET, a second termination region of the opposite conductivity type, for example P conductivity type, is formed within a selected one of the emitter or collector regions. The second termination region extends to the principal surface and is spaced from the base region such that, at the principal surface, a gap is defined between the second termination region and the base region. A second MOSFET depletion mode channel region of the opposite conductivity type, for example P conductivity type, is provided at the principal surface in the gap connecting the second termination region and the base region. Preferably, the second MOSFET depletion mode channel region is formed by known ion implantation processes. To complete the structure of the second MOSFET, a second MOSFET gate insulating layer is disposed on the principal layer over at least a portion of the second MOSFET depletion mode channel region, and a second MOSFET conductive gate electrode is disposed on the second MOSFET gate insulating layer at least laterally over a portion of the depletion mode channel region. Finally, there is an ohmic electrical connection between the second termination region and the emitter region such that, when conducting, the channel of the second MOS- FET device electrically connects the bipolar transistor emitter and base regions for turning off the bipolar transistor.

As summarized above, the second termination region comprising the drain electrode of the depletion mode MOSFET may, in accordance with the invention, be formed within a selected one of either the emitter or collector regions. In the event the second termination region is formed within the bipolar transistor emitter region, the structure of the second MOSFET is intimately interdigitated with the structure of the bipolar transistor. In the event the second termination region is formed within the collector region, the second termination region is, in the device structure, removed to one side of the bipolar transistor. This allows the bipolar transistor to have somewhat larger surface area, but at the expense of having to provide, on the integrated device, a wired connection between the second termination region and the bipolar transistor emitter.

The corresponding structure of a MOSFET-gated thyristor integrated device is similar with the exceptions that a four-layer semiconductor switching device structure replaces the three-layer active structure of the bipolar transistor, and the first MOSFET termination region comprises an extension of the device cathode region, rather than being a separate region ohmically connected to the P-base region. In particular, the four-layer semiconductor switching device has a principal surface and includes, in order, an anode region layer located farthest from the principal surface and of P conductivity type. (There is no directly corresponding active region layer in the bipolar transistor structure summarized above. In the bipolar transistor structure, this particular layer comprises merely a semiconductor wafer substrate, of the same conductivity type as the collector region, but with a higher doping level).

Next in the four-layer semiconductor switch structure s a first base region layer of N conductivity terminating at he principal surface and defining a first PN junction with the node region layer. This first base region layer in the thyristor integrated device structure corresponds to the collector of the bipolar transistor device structure.

Next, there is a second base region layer of P conductivity type formed within the first base region, defining a second PN junction with the first base region. The second base region is of limited lateral extent and has a periphery terminating at the principal surface. The second base region layer of the thyristor integrated device corresponds to the base of the bipolar transistor integrated device.

The fourth layer of the semiconductor switching device is a cathode region layer of N conductivity type formed within the second base region and defining a third PN junction with the second base region. The cathode region is of limited lateral extent and has a periphery terminating at the principal surface. The cathode region of the thyristor integrated device corresponds to the emitter region of the bipolar transistor form of device.

In the thyristor form of device, the structures of the MOSFETs generally correspond to those of the MOSFETs included first termination region of N conductivity type is formed within the second base region as an extension of the cathode region and extends to the principal surface. The first termination region is spaced from the first base region such that, at the principal surface, a portion of the second base region exists as a band of P conductivity type between the first termination region and the first base region. A first MOSFET gate insulating layer is disposed on the principal surface over at least a portion of the band, and a first MOSFET conductive gate electrode is disposed on the first MOSFET gate insulating layer at least laterally over a portion of the first band, such that a first enhancement mode MOSFET device is defined arranged to establish a channel of N conductivity type extending between the first base region and the first termination region.

The second termination region is of P conductivity type and is formed within a selected one of the cathode or second base regions. The second termination region extends to the principal surface and is spaced from the second base region such that at the principal surface is defined between the second termination region and the second base region. A second MOSFET depletion mode channel region of P conductivity type is formed at the principal surface, preferably by ion implantation, in the gap connecting the second termination region and the second base region. A second MOSFET gate insulating layer is disposed on the principal surface over at least a portion of the second MOSFET depletion mode channel, and a second MOSFET conductive gate electrode is disposed on the second MOSFET gate insulating layer at least laterally over a portion of the depletion mode channel region. Finally, an ohmic electrical connection is provided between a second termination region and the emitter region such that, when conducting, the channel of the second MOSFET device electrically connects the switching device cathode and second base regions for turning off the switching device.

The preferred form of device structure in accordance with the invention is a planar structure as summarized above, with the MOSFETs, fabricated employing diffusion techniques ("D-MOS"). However, it will be appreciated that there are equivalent device structures wherein the MOSFETs are formed by etching V-grooves extending through at least two device layers such that the MOSFET channel surfaces are defined within the sides of the V-grooves, providing a structure known in the art as "V-MOS".

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings, in which:

DESCRIPTION OF THE PREFERRED EMBODIMENTS

It is believed that the present invention will be better understood and appreciated in view of the specific structures and equivalent electrical circuits of two representative prior art devices. In particular, a prior art MOSFET-gated bipolar transistor is described hereinbelow with reference to FIGS. 1A and 2A, and a prior art MOSFET-gated thyristor is described hereinbelow with reference to FIGS. 2A and 2B.

Figure 1A:
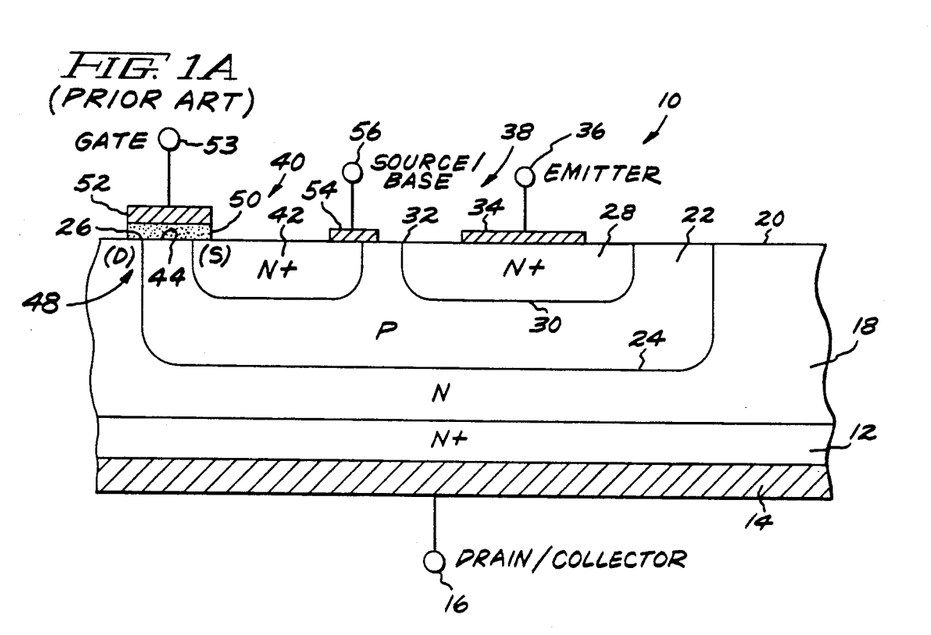
FIG. 1A is a sectional side view depicting a representative prior art MOSFET-gated bipolar transistor device structure.

Referring first to FIG. 1A, there is depicted in sectional side view a prior art MOSFET-gated bipolar transistor integrated device 10 representative of the devices disclosed in the above-cited Zommer article entitled "Monolithic H.V. BIP MOS".

The FIG. 1A integrated device 10 is formed on a semiconductor substrate 12 of N+ conductivity type having collector metallization 14 in ohmic contact therewith, in turn connected to a device collector terminal 16. The actual bipolar transistor collector region 18 is an N conductivity type semiconductor region 18 formed over the substrate 12, such as by conventional epitaxial growth techniques, and having a principal surface 20. A base region 22 of P conductivity type semiconductor is formed within the collector region 18 such that at least a portion of the interface 24 between the base 22 and collector 18 regions forms the bipolar transistor collector/base junction. The base region 22 is of limited lateral extent, and has a periphery 26 terminating at the collector region 18 principal surface 20. An emitter region 28 of N+ conductivity type semiconductor is formed within the base region 22 such that at least a portion of the interface 30 between the emitter 28 and base 22 regions forms the bipolar transistor emitter/base junction. The emitter region 28 is of limited lateral extent, and also has a periphery 32 terminating at the principal surface 20. Emitter metallization 34 is provided in ohmic contact with the emitter region 28, and is connected to a device emitter terminal 36.

Thus, there is defined within the overall device 10 a diffused junction NPN bipolar transistor 38 comprising collector (C) 18, base (B) 22 and emitter (E) 28 regions.

Included in the same integrated structure is an enhancement mode, N-channel MOSFET, generally designated 40. To provide a MOSFET source (S) region, a diffused termination region 42 of N+ conductivity type is formed within the base region 22 spaced from the collector region 18 at the surface 20 by a band 44 of P conductivity type semiconductor material comprising an extension of the base region 22. The drain (D) electrode region 48 of the MOSFET 40 comprises an extension of the collector region 18. To complete the structure of the MOSFET 40, a gate insulating layer 50, such as silicon dioxide, is disposed on the principal surface 20 over the band 44, and a conductive gate electrode 52, such as evaporated aluminum, is disposed on the gate insulating layer 50 at least laterally over the band 44. The gate electrode 52 is in turn connected to a device gate terminal 53.

The MOSFET 40 thus defined is of the enhancement mode type, the channel of which is normally non-conducting. As is known, in the operation of an N-channel enhancement mode MOSFET, such as the MOSFET 40, when a positive gate voltage is applied to the gate electrode 52, an electric field is created which extends through the gate insulating layer 50 into the base region 22, and induces a thin N-type conductive channel just under the surface 20 below the gate insulating layer 50 and gate electrode 52. This induced channel then comprises a conductive path between the source 42 and drain 48 regions, being of the same conductivity type. As is known, the more positive the gate voltage, the thicker this conductive channel becomes, and the more working current flows.

In the prior art structure of FIG. 1A, the MOSFET 40 drain region 48 and the bipolar transistor collector region 18 are inherently connected because they are portions of the same N conductivity type semiconductor region. In the particular structure depicted in FIG. 1A an ohmic connection in the form of a metallized shorting bar 54 is provided between the N+ termination region 42 comprising the MOSFET 40 source region and the bipolar transistor base region 22.

As a result of the shorting bar 54, when the MOSFET 40 conducts, current from the collector region 18 and thus the drain region 48 is conducted into the base region 22, providing base current for the bipolar transistor 38 and further turning on the transistor 38.

Significantly, to ensure that the bipolar transistor 38 can be turned off, the FIG. 1A prior art device 10 includes an auxiliary terminal 56 connected to the shorting bar 54, and thus to the bipolar transistor 38 base region 22. In some prior art devices a shorting resistor (not shown) is connected between the base region 22 and the emitter region 28 to provide a further path for stored base charge when the device is to be turned off and base drive is removed. However, such a resistor also increases the base drive requirements when the device is in an ON state, thus requiring a larger drive MOSFET 40 to accommodate the increased base drive requirement.

Figure 1B:
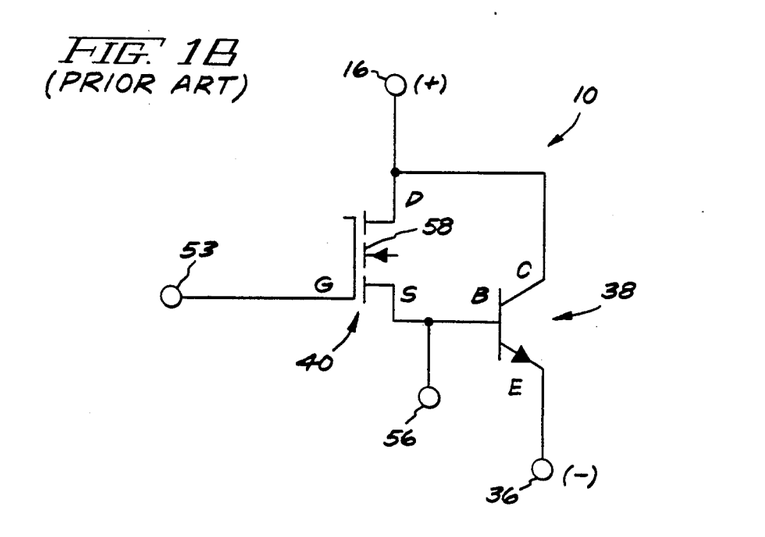
FIG. 1B is an electrical schematic diagram of the equivalent circuit of the prior art device of FIG. 1A.

Referring now to FIG. 1B, in the equivalent circuit of the FIG. 1A MOSFET-gated bipolar transistor integrated device 10, it can be seen that the enhancement mode N-channel MOSFET 40 has its drain (D) and source (S) terminals connected between the collector (C) and base (B) terminals of the bipolar transistor 38 so as to bias the bipolar transistor 38 into conduction when the MOSFET 40 conducts. In the FIG. 1B schematic depiction, the MOSFET 40 channel bar 58 has breaks to indicate that the MOSFET 40 is an enhancement mode type wherein the current conduction path is normally interrupted, and that gate voltage is necessary to bias the MOSFET device 40 into conduction.

In the particular prior art device 10 represented in FIGS. 1A and 1B, there is no reliable mechanism included within the integrated device 10 itself for turning off the bipolar transistor 38. For this purpose, the auxiliary base terminal 56 and the device emitter (E) terminal 36 can be electrically connected through suitable external connections in the actual circuit (not shown) within which the device 10 is utilized.

Figure 2A:
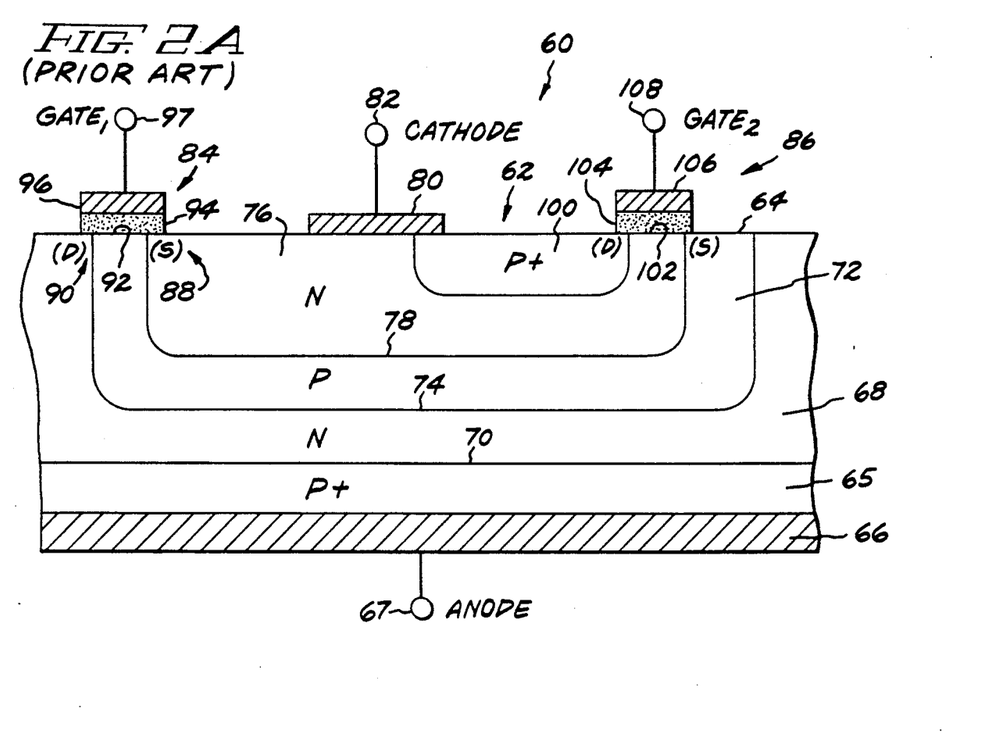
FIG. 2A is a sectional side view depicting a representative prior art MOSFET-gated thyristor device structure.
Figure 2B:
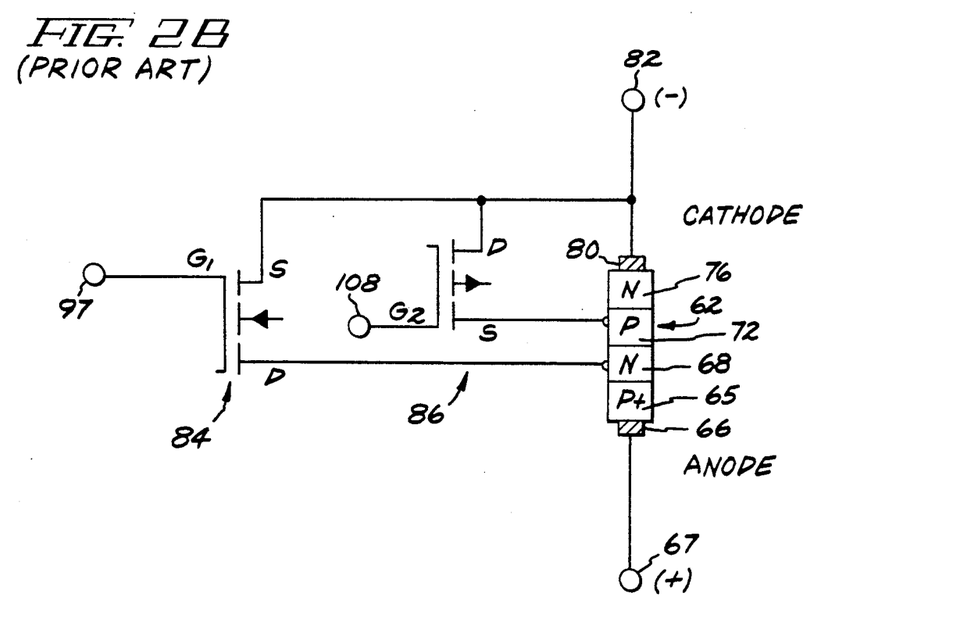
FIG. 2B is an electrical schematic diagram of the equivalent circuit of the prior art device of FIG. 2A.

With reference now to FIGS. 2A and 2B, there is represented one form of prior art MOSFET-gated thyristor integrated device 60, such as is suggested in the above-cited commonly-assigned Temple application Ser. No. 331,049 filed Dec. 16, 1981, entitled "SEMICONDUCTOR DEVICE WITH IMPROVED TURN-OFF CAPABILITY", as mentioned above.

The integrated device 60 of FIG. 2A comprises a four-layer semiconductor switching device 62 having a principal surface 64 and including, in order, first a P+ conductivity type anode region layer 65 located farthest from the principal surface 64 with metallization 66 connected to a device anode terminal 67. Next is a first base region layer 68 of N conductivity type terminating at the principal surface 64 and defining a first PN junction 70 with the anode region 66, and then a second base region layer 72 of P conductivity type formed within the first base region 68 and defining a second PN junction 74 with the first base region 68. The second base region 72 is of limited lateral extent and has a periphery terminating at the principal surface 64. Finally, a cathode region layer 76 of N conductivity type is formed within the second base region 72 and defines a third PN junction 78 with the second base region 72. The cathode region 76 is also of limited lateral extent, and has a periphery terminating at the principal surface 64. To provide a cathode terminal, metallization 80 is provided in ohmic contact with the cathode region 76, and electrically connected to a device cathode terminal 82.

In the prior art MOSFET-gated thyristor integrated device 60 of FIGS. 2A and 2B, there are two MOSFETs for control purposes. The first of these is an N-channel enhancement mode MOSFET, generally designated 84, connected for turning the four-layer switching device 62 on, and the second is a P-channel enhancement mode MOSFET, generally designated 86, connected for turning the four-layer semiconductor switching device 62 off.

In particular, the source (S) region 88 of the first MOSFET 84 comprises a first termination region of N conductivity type. In the particular device structure of FIG. 2A, this first termination region comprises simply an extension of the cathode region 76. The drain (D) electrode region 90 of the first MOSFET 84 comprises an extension of the first base region 68, of N conductivity type. Thus, at the principal surface 64 a portion of the second base region 72 exists as a band 92 of P conductivity type between the N conductivity type source region 88 and the MOSFET drain region 90 comprising an extension of the first base region 68. To complete the MOSFET structure, a gate insulating layer 94 and gate metallization 96 are appropriately disposed over the band 92 such that, in operation, a thin N-type conductive channel is induced just under the surface 64 below the gate insulating layer 94 and gate electrode 96. A first gate terminal 97 is connected to the gate metallization 96.

As may best be seen from the equivalent circuit schematic diagram of FIG. 2B, the source (S) and drain (D) of this first N-channel, enhancement mode MOSFET 84 are connected between the thyristor 62 N-base region 68 and the cathode region 76 so as to trigger the four-layer switching device 62 into conduction when the MOSFET 84 conducts, as will be appreciated by those skilled in the art.

The second enhancement mode MOSFET 86 is connected for turning off the four-layer semiconductor switching device 62 by withdrawing majority-carrier holes from the P conductivity type base 72 when the second MOSFET 86 conducts. Considering the structure of the second MOSFET 86, to provide a MOSFET drain (D) region, a second termination region 100 of P+ conductivity type is formed within the cathode region 76. The second termination region 100 extends to the principal surface 64 and is spaced from the second base region 72 such that at the principal surface 64 a portion of the cathode region 76 exists as a band 102 of N conductivity type between the second termination region 100 and the first base region 72. The MOSFET 86 source (S) region comprises an extension of the P conductivity type second base region 72.

To complete the structure of the second MOSFET 86, a gate insulating layer 104 and gate electrode 106 connected to a second gate terminal 108 are appropriately disposed over the band From this structure, it will be appreciated that the second MOSFET device 86 is a P-channel enhancement mode MOSFET. In operation, the MOSFET 86 is normally non-conducting. When negative gate voltage is applied to the second gate terminal 108 and metallization 106, an electric field is created which extends through the gate insulating layer 104 to induce a thin P-type conductive channel just under the surface 64 below the insulating layer 104 and gate electrode 106.

Advantageously, the gate electrodes 97 and 108 in the MOSFET-thyristor integrated device 60 of FIGS. 2A and 2B may be connected together. Thus, in operation, the device 60, and more particularly the four-layer semiconductor switching device portion thereof, turns on when a positive voltage is applied to the gates to bias the first MOSFET 84 into conduction. The device turns off when a negative gate voltage is applied to bias the second MOSFET 86 into conduction while the first MOSFET 84 no longer conducts.

Unlike the prior art device 60 of FIGS. 2A and 2B, one of the features of the present invention is the elimination of the necessity to provide gating voltages of opposite polarity for turning on and turning off the device.

Figure 3:
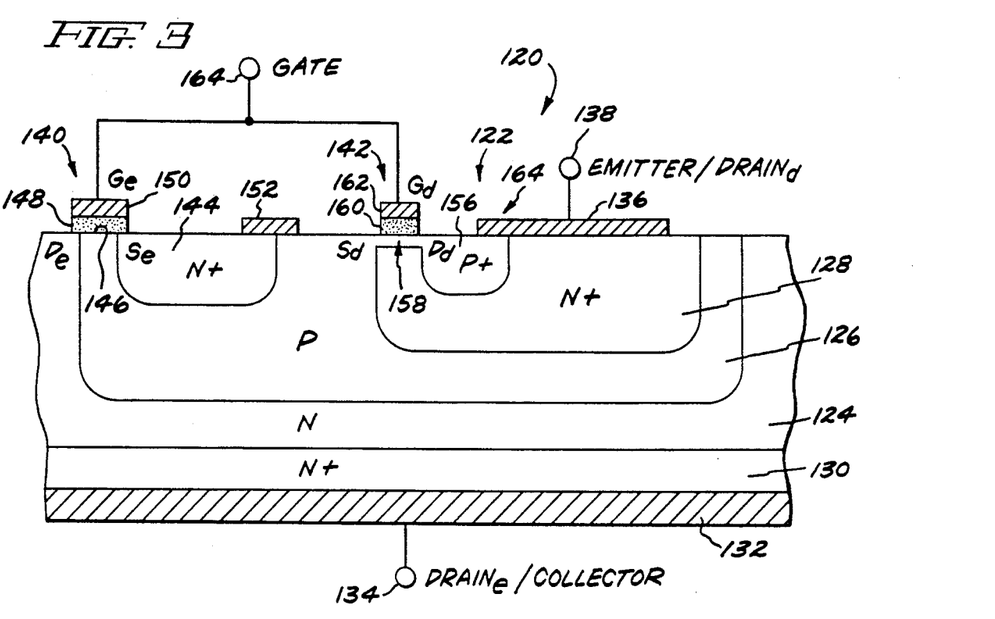
FIG. 3 is a sectional side view depicting one form of MOSFET-gated bipolar transistor structure in accordance with the present invention.
Figure 4:
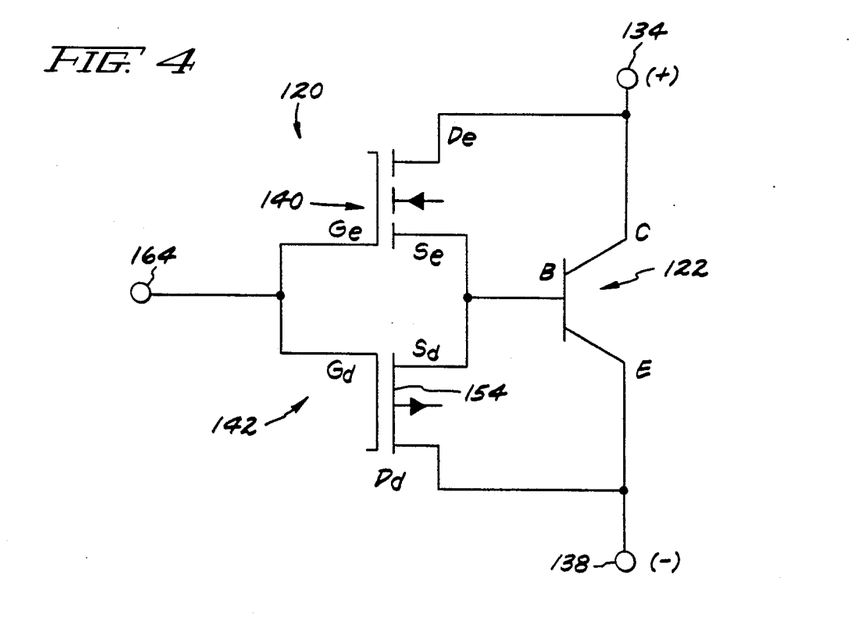
FIG. 4 is an electrical schematic diagram of the equivalent circuit for the inventive device structure of FIG. 3.

Referring now to FIG. 3, there is illustrated, in accordance with one embodiment of the invention, the structure of a MOSFET-gated bipolar transistor integrated device 120 having single input polarity turn-on and turn-off control. In FIG. 4 is shown the equivalent electrical circuit of the integrated device 120 of FIG. 3.

At this point it should be noted, as will be appreciated by those skilled in the art, that MOSFET-gated devices such as the device 120 may be provided with a variety of surface geometric arrangements, and there is accordingly no intention to limit the invention to any particular geometric arrangement. A typical structure for a power bipolar transistor is a comb-like arrangement with interdigitated metallized base and emitter regions. Similarly, it will be appreciated that the structures depicted herein are merely representative portions which, in actual power devices, repeat in symmetrical fashion.

In FIG. 3, the basic bipolar transistor is a diffused-junction NPN transistor 122 comparable to the transistor 38 described hereinabove with reference to FIGS. 1A and 1B. The transistor 122 includes an N conductivity type collector region 24, a P conductivity type base region 126 and an N+ conductivity type emitter region 128. Electrical connection to the collector region 124 is provided through an N+ conductivity type device substrate 130 having collector metallization 132 electrically connected to a device collector terminal 134.

Emitter metallization 136 is provided in ohmic contact with the emitter region 128 and electrically connected to a device emitter terminal 138. For control of the bipolar transistor 122, a pair of MOSFETS 140 and 142 are provided.

The first MOSFET 140 is an N-channel enhancement mode connected between the bipolar transistor 122 collector (C) and base (B) 126 regions in a manner comparable to the prior art devices. More particularly, the source electrode of the first MOSFET 140 comprises a first termination region 144 of N+ conductivity type formed within the base region 126. To clearly indicate that the MOSFET 140 is an enhancement mode MOSFET, the subscript "e" is appended to the terminal designations, i.e., $S_e$. The first termination region 144 extends to the device principal surface and is spaced from the collector region 124 such that at the principal surface a portion of the base region 126 exists as a band 146 of opposite conductivity type (P conductivity type) between the first termination region 144 and the collector region 124, both of N conductivity type. To complete the structure of the first MOSFET 140, a first MOSFET gate insulating layer 148 is disposed on the principal surface over at least a portion of the band 146, and a first MOSFET conductive gate ($G_e$) electrode 150 is disposed on the gate insulating layer 148 at least laterally over a portion of the band 146.

The drain ($D_e$) terminal of the first MOSFET 140 is inherently connected to the bipolar transistor 122 collector 124. To connect the source ($S_e$) electrode of the first MOSFET 140 to the bipolar transistor 122 base region 126, a metallized shorting bar 152 is provided in ohmic contact with both the first termination region 144 and the base region 126. No external connection to the shorting bar 152 is required. Thus, the device 120 is a triode.

In operation, the enhancement mode N-channel MOSFET 140 is non-conducting when zero (or negative) gate voltage is applied. When positive gate voltage is applied, a thin N conductivity type channel is induced just below the surface beneath the gate oxide 148 and gate electrode 150, establishing the conduction channel for the first MOSFET 140. This conduction channel provides base current for the bipolar transistor 122 to turn on the transistor The second MOSFET 142 is provided for reliably turning off the bipolar transistor 122. In particular, as may be seen best from FIG. 4, the source ($S_d$) and drain ($D_d$) terminals of the second MOSFET 142 are connected between the base (B) and emitter (E) terminals of the bipolar transistor 122. In the nomenclature employed herein, a subscript "d" is appended to denote the electrodes of the depletion mode MOSFET 142.

Significantly, in accordance with the present invention, the second MOSFET 142 is of the depletion mode type which is normally conducting with zero gate voltage, and requires that a gate voltage be applied in order to turn off the second MOSFET 142. Accordingly, in the FIG. 4 electrical schematic drawing, the second MOSFET 142 channel bar 153 is continuous, with no breaks. In the particular device structure illustrated, the channel of the depletion mode MOSFET 142 is of P conductivity type.

Figure 7:
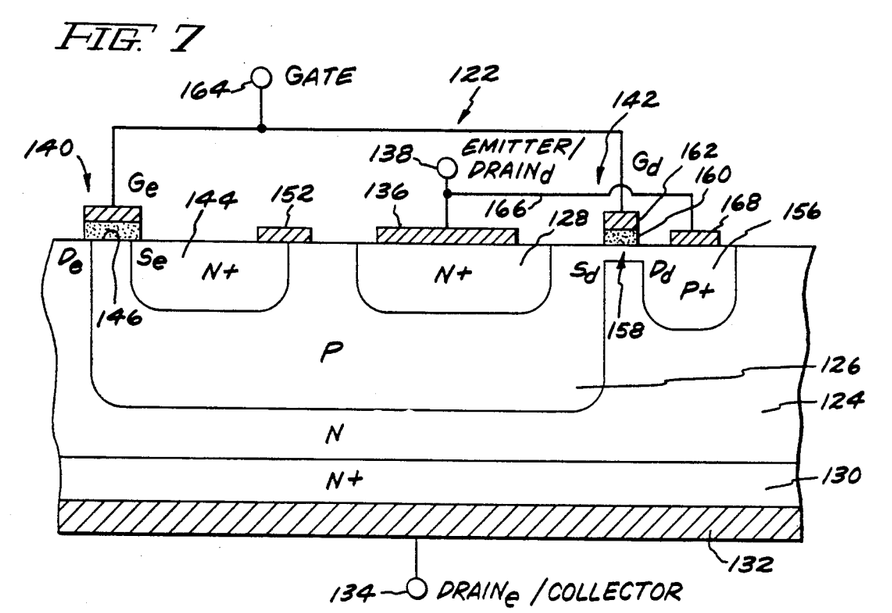
FIG. 7 is a cross-sectional view of an alternative MOSFET-gated bipolar transistor integrated device structure in accordance with the present invention.

Referring again to FIG. 3 for the specific structure of the second MOSFET 142, the MOSFET 142 drain ($D_d$) region comprises a second termination region 156 of P+ conductivity type formed within a selected one of either the emitter 128 or collector 124 regions. In the specific embodiment of FIG. 3, the second termination region 156 is formed within the bipolar transistor emitter region 128. The alternative mentioned hereinabove wherein the second termination region 156 is formed within the collector region 124 is depicted in FIG. 7, hereinafter described.

The second termination region 156 extends to the device principal surface and is spaced from the base region 126 such that, at the principal surface, a gap 158 is defined between the second termination region 156 and the base region 126. Since the MOSFET 142 is a depletion mode MOSFET, a depletion mode channel region of P conductivity type is formed in the gap 158 connecting the second termination region 156 and the base region 126. In accordance with the invention, it is contemplated that the depletion mode channel be an implanted region formed employing ion implantation. Known ion implant processes may be employed, such as those described in J. F. Gibbons, "Ion Implantation in Semiconductors—Part I: Range Distribution Theory and Experiments", Proc. IEEE, Vol. 56, No. 3, pp. 295-319 (Mar. 1968); and J. F. Gibbons, "Ion Implantation in Semiconductors—Part II: Damage Production and Annealing", Proc. IEEE, Vol. 60, No. 9, pp. 1062-1096 (Sept. 1972).

To complete the structure of the second MOSFET 142, a second MOSFET gate insulating layer 160 is disposed on the principal device surface over at least a portion of the second MOSFET depletion mode channel region 158 and a second MOSFET conductive gate ($G_d$) electrode 162 is disposed on the gate insulating layer 160 at least laterally over a portion of the depletion mode channel region 158.

While the disclosed embodiments employ an implanted region for the normally-conducting (with zero gate voltage) depletion-mode MOSFET channels, it will be appreciated by those skilled in the art that there are other ways to create a normally-conducting characteristic in a MOSFET. As one example, surface charge layers may be included in the gate insulating layer.

The connection between the MOSFET 142 source ($S_d$) and the bipolar transistor 122 base (B) is inherent, because both electrode regions comprise extensions of the same P conductivity type base region 126. An electrical ohmic connection between the second termination region 156 comprising the MOSFET 142 drain ($D_d$) terminal and the emitter (E) region 128 is provided, in the embodiment of FIG. 3, simply by an extension 164 of the emitter metallization 136, in ohmic contact with the termination region 56.

In the operation of the second MOSFET 142, the depletion mode channel 158 is normally (with zero gate voltage) conducting because there exists a continuous conductive path through P conductivity type semiconductor material. When a positive gate voltage is applied, an electric field is created and extends from the gate metallization 162 through the gate insulating layer 160 into the implanted channel region 158, driving majority-carrier holes out of the channel region 158, eventually choking off conduction.

Significantly, a positive gate voltage is required to bias the enhancement mode N channel MOSFET 14C into conduction and a positive voltage is also required to bias the depletion mode P-channel MOSFET 142 out of conduction. Thus, the gate electrode layers 150 and 162 of these two MOSFETS 140 and 142 are advantageously connected together and to a single device gate terminal device 120. Specifically, in the illustrated MOSFET-gated NPN bipolar transistor device 120, the device is non-conducting with zero gate voltage, and conducting with positive gate voltage. If a PNP bipolar transistor were to be produced by reversing all semiconductor conductivity types throughout the device, then the resultant device would be non-conducting with zero gate voltage and conducting when negative gate voltage is applied.

For proper operation of the device 120, it will be appreciated that the two MOSFETs 140 and 142 should not be conducting at the same time which, in effect, would momentarily short out the device, resulting in excessive power consumption. Thus, the threshold voltage of the depletion mode P channel MOSFET 142 is adjusted by controlling the doping level of the P implant to ensure that the depletion mode P-channel MOSFET 142 is biased completely off when the enhancement mode N-channel MOSFET 144 is turning on.

Figure 5:
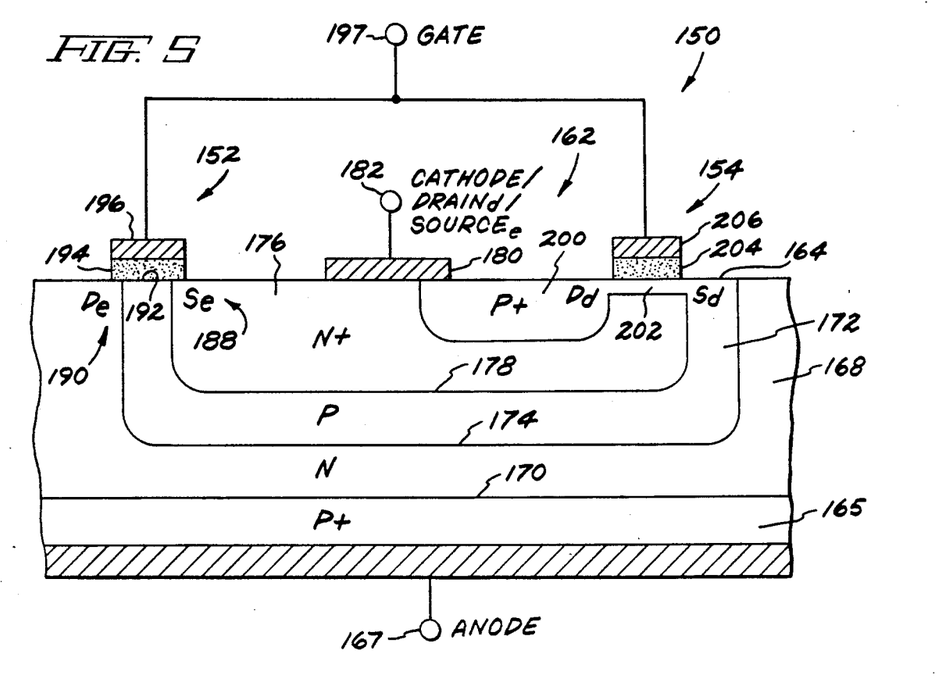
FIG. 5 is a sectional side view of the structure of a MOSFET-gated thyristor integrated device in accordance with the present invention.
Figure 6:
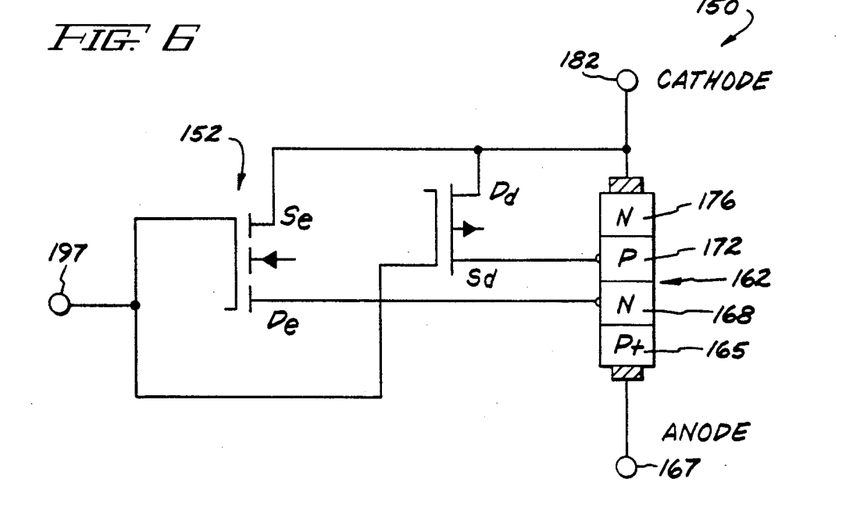
FIG. 6 is an electrical schematic diagram of the equivalent circuit of the inventive device structure of FIG. 5.

Referring next to FIG. 5, there is shown, in accordance with another embodiment of the invention, the structure of a MOSFET-gated thyristor integrated device 150 having single input polarity turn-on and turn-off control. FIG. 6 depicts the equivalent electrical circuit of the device 150.

In general, the MOSFET-gated thyristor device 150 of FIGS. 5 and 6 is similar to the prior art MOSFET-gated thyristor device 60 of FIGS. 2A and 2B, and includes a pair of MOSFETs 152 and 154 respectively connected for turning on and turning off the device 150. The FIGS. 5 and 6 MOSFET 152 generally corresponds to the FIGS. 2A and 2B MOSFET 84, and likewise is an N-channel enhancement mode MOSFET. However, the MOSFET 154 of FIGS. 5 and 6 is a depletion mode MOSFET, unlike the enhancement mode MOSFET 86 of FIGS. 2A and 2B. The MOSFETs 86 and 154 are both P-channel devices in the illustrated embodiments.

As in the case of the prior art device 60 of FIGS. 2A and 2B, the integrated device 150 of FIGS. 5 and 6 comprises a four-layer semiconductor switching device 162 having a principal surface 164 and including in order, first a P+ conductivity type anode region layer 165 located farthest from the principal surface 164 with metallization 166 connected to a device anode terminal 167. Next is a first base region layer 168 of N conductivity type terminating at the principal surface 164 and defining a first PN junction 170 with the anode region 166, and then a second base region layer 172 of P conductivity type formed within the first base region 168 and defining a second PN junction 174 with the first base region 168 and defining a second PN junction 174 with the first base region 168. The second base region 172 is of limited lateral extent and has a periphery terminating at the principal surface 164. Finally, a cathode region layer 176 of N conductivity type is formed within the second base region 172 and defines a third PN junction 178 with the second base region 172. The cathode region 176 is also of limited lateral extent, and has a periphery terminating at the principal surface 164. To provide a cathode terminal, metallization 180 is provided in ohmic contact with the cathode region 176, and electrically connected to a device cathode terminal 182.

In accordance with conventional practice, the four-layer switching device 162 may be viewed as the combination of a PNP bipolar transistor and an NPN bipolar transistor with the collector of each bipolar transistor connected to the base of the other bipolar transistor. The PNP bipolar transistor is the lower one in the orientation depicted in FIGS. 5 and 6, and its emitter, base and collector regions correspond respectively to the anode 165, first base 168 and second base 172 regions of the device 162. The NPN bipolar transistor is the upper one, and its emitter, base and collector regions correspond respectively to the cathode 176, second base 172 and first base 168 regions of the device 162. The structure of and interconnection of the two MOSFETs and 154 with the four-layer switching device 162 of FIGS. 5 and 6 is generally similar to the arrangement of FIGS. 2A and 2B, exception that the MOSFET 154 is an enhancement mode device, normally conducting with zero gate voltage. In particular, the source ($S_e$) region 188 of the N-channel enhancement-mode MOSFET 152 comprises a first termination region of N conductivity type. In the particular device structure of FIG. 5, this first termination region comprises simply an extension of the cathode region 176. The drain ($D_e$) electrode region 190 of the MOSFET 152 comprises an extension of the first base region 168, of N conductivity type. Thus, at the principal surface 164 of a portion of the second base region 172 exists as a band 192 of P conductivity type between the N conductivity type source region 188 and the MOSFET 152 drain region 190 comprising an extension of the first base region 168. To complete the MOSFET 152 structure, a gate insulating layer 194 and gate metallization 196 are appropriately disposed over the band 192 such that, in operation, a thin N-type conductive channel is induced just under the surface 164 below the gate insulating layer 194 and gate electrode 196. The gate metallization 96 is connected to a device gate terminal 197.

As may best be seen from the equivalent circuit schematic diagram of FIG. 6, the source ($S_e$) and drain ($D_e$) of this N-channel, enhancement mode MOSFET 152 are connected between the thyristor 162 N-base region 168 and the cathode region 176 so as to trigger the four-layer switching device 162 into conduction when the MOSFET 152 conducts.

Considering the structure of the P-channel depletion-mode MOSFET 154, to provide a MOSFET drain ($D_d$) region, a second termination region 200 of P+ conductivity type is formed within the cathode region 176. The second termination region 200 extends to the principal surface 164 and is spaced from the second base region 172 such that at the principal surface 164 a gap 202 is defined between the second termination region 200 and the second base region 172. Since the MOSFET 154 is a depletion-mode MOSFET, a depletion mode channel region of P conductivity type is formed in the gap. In accordance with the invention, it is contemplated that the depletion mode channel is an implanted region formed employing ion implantation as mentioned hereinabove with reference to FIG. 3.

The connection between the MOSFET 154 source ($S_d$) and the thyristor 162 second base 172 regions is inherent because both comprise extensions of the same P conductivity type region.

To complete the structure of the MOSFET 154, a gate insulating layer 204 and gate electrode 206 connected to the gate terminal 197 are appropriately disposed over the channel region 202.

Operation of the overall device 150 of FIGS. 5 and 6 is generally the same as for the four-layer device 60 of FIGS. 2A and 2B, except for the means for turning off the device. For turning on the device 150, positive gate voltage is applied, biasing the four-layer switching device 162 into conduction by, in effect, injecting electrons from the cathode region 176 (of N conductivity type) into the first base region layer 168 (of N conductivity type). This, in effect, turns on the lower PNP bipolar transistor by providing base current to it. This action, then, turns on the upper NPN bipolar transistor since holes from the P+ conductivity type anode region 165 are conducted into the P conductivity type second base region 172, thus providing base current for the NPN bipolar transistor. In a regenerative switching action, further base current for the lower PNP bipolar transistor comes through the upper NPN transistor, and the initial gate signal is no longer needed. At this point, the device 162 is latched on and will sustain conduction through itself, with each bipolar transistor providing base current for the other bipolar transistor.

When zero gate voltage is applied, the N-channel enhancement mode MOSFET 152 no longer conducts, and the P-channel depletion mode MOSFET 154 conducts, connecting the second base region layer 172 to the device cathode 176 (which in circuit operation, is at the most negative potential). This turns off the upper NPN bipolar transistor, withdrawing the electrons previously supplied from the cathode 176 to drive the lower PNP bipolar transistor, shutting off device conduction.

Referring now to FIG. 7, there is illustrated a modified version of the FIG. 3 MOSFET-gated bipolar transistor integrated device 120 wherein the second termination region 156 of P+ conductivity type is formed within the collector region 124, rather than within the emitter region 128. In the FIG. 7 arrangement, the second termination region 156 is still spaced from the base region 126, and the channel 158, preferably an implanted channel 158, of P conductivity type is disposed just below the device surface beneath the second MOSFET gate insulating layer 160 and second gate MOSFET metallization 162.

One slight disadvantage of the structure of FIG. 7 is that a separate wired connection 166 must be included in the integrated device in order to connect metallization 168 on the second termination region 156 serving as the drain electrode of the second MOSFET 142 back to the emitter metallization 136. This is not particularly difficult to accomplish employing conventional techniques. One advantage of the FIG. 7 structure over the FIG. 3 structure is that because no interdigitation of MOSFET and bipolar transistor structures is required, the bipolar transistor portion of the device can occupy a separate portion of the integrated device and be made with a larger surface area than would be practical if it were integrated with the MOSFET portion.

Insofar as operation and equivalent circuits are concerned, the MOSFET-gated bipolar transistor integrated device 120 of FIG. 7 is identical to the device of FIG. 3.

While not specifically illustrated, it will be appreciated that the MOSFET-gated bipolar thyristor structure 150 of FIG. 5 can be similarly modified by forming the second termination region 200 within the N conductivity type first base region 168, with appropriate depletion mode MOSFET structure.

Figure 8:
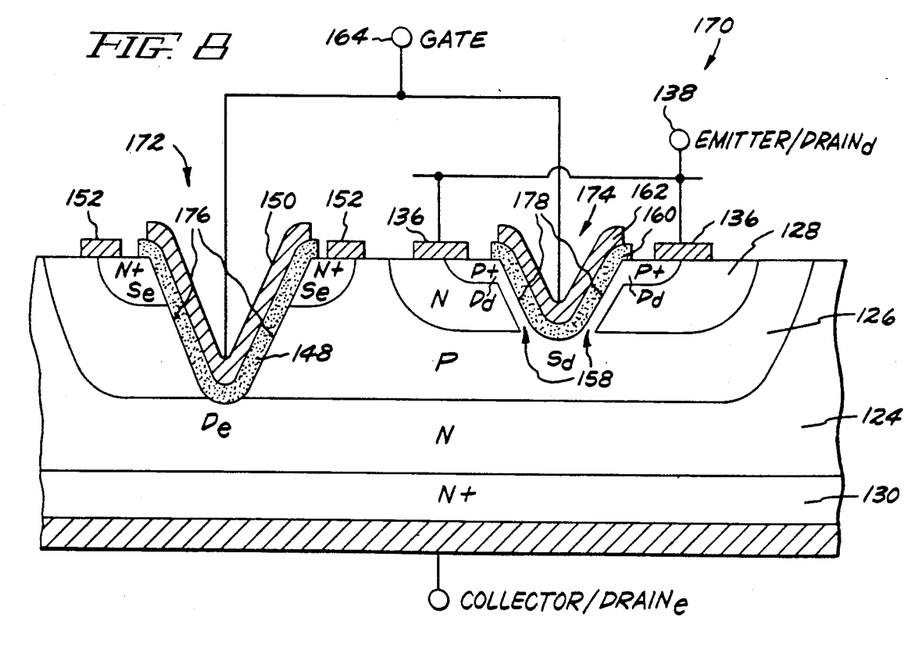
FIG. 8 is a sectional side view depicting a device in accordance with the present invention fabricated employing V-MOS technology.

Referring finally to FIG. 8, there is shown another form of device 170 illustrating the manner in which the principles of the present invention can be applied to hybried integrated devices employing V-MOS technology to form the two MOSFETS required The device 170 is a MOSFET-gated bipolar transistor integrated device generally comparable to the MOSFET-gated bipolar transistor integrated device 120 of FIG. 3.

In FIG. 8, two MOSFETS are included, an enhancement mode N-channel MOSFET 172 (comparable to the MOSFET 140 of FIG. 3) and a depletion mode P-channel MOSFET 174 (generally comparable to the depletion mode P-channel 142 of FIG. 3). The MOSFET channel surfaces in the devices 172 and 174 of FIG. 8 are not provided on the planar surfaces of the device as depicted in FIG. 3. Rather, MOSFET channel surfaces 176 and 178 for the two MOSFETS 172 and 174 are respectively provided within etched V-grooves, employing conventional fabrication techniques. In all other respects, the devices operate as described hereinabove.

While specific embodiments of the invention have been illustrated and described herein, it is realized that numerous modifications will occur to those skilled in the art. It is therefore to be understood that the appended claims are intended to cover all such modifications as fall within the true spirit and scope of the invention.

What is claimed is:

1. A MOSFET-gated thyristor integrated device having single polarity turn-on and turn-off control, said integrated device comprising:
   a four-layer semiconductor switching device including, in order, an anode region layer of P conductivity type, a first base region layer of N conductivity type, a second base region layer of P conductivity type, and a cathode region layer of N conductivity type;
   an enhancement mode MOSFET having a gate electrode and having one main electrode connected to said cathode region layer and another main electrode connected to said first base region layer for biasing said switching device into conduction when said enhancement mode MOSFET is conducting; and
   a depletion mode MOSFET having a gate electrode and having one main electrode connected to said second base region layer and another main electrode connected to said cathode region layer for turning off said switching device when said depletion mode MOSFET is conducting.

2. A MOSFET-gated thyristor device in accordance with claim 1, which further comprises an electrical connection between said MOSFET gate electrodes.

3. A MOSFET-gated thyristor device in accordance with claim 1, wherein said enhancement mode MOSFET has a channel of N conductivity type, and said depletion mode MOSFET has a channel of P conductivity type.

4. A MOSFET-gated thyristor device in accordance with claim 2, wherein said enhancement mode MOSFET has a channel of N conductivity type, and said depletion mode MOSFET has a channel of P conductivity type.

5. A MOSFET-gated thyristor integrated device having a single input polarity turn-on and turn-off control, said integrated device comprising:
   a four-layer semiconductor switching device having a principal surface and including, in order, an anode region layer located farthest from said principal surface and of P conductivity type; a first base region layer of N conductivity type terminating at said principal surface and defining a first PN junction with said anode region layer; a second base region layer of P conductivity type formed within said first base region and defining a second PN junction within said first base region, said second base region being of limited lateral extent and having a periphery terminating at said principal surface; and a cathode region layer of N conductivity type formed within said second base region and defining a third PN junction with said second base region, said cathode region being of limited lateral extent and having a periphery terminating at said principal surface;

a first termination region of N conductivity type formed within said second base region as an extension of said cathode region, said first termination region extending to said principal surface and spaced from said first base region such that at said principal surface a portion of said second base region exists as a band of P conductivity type between said first termination region and said first base region;

a first MOSFET gate insulating layer disposed on said principal surface over at least a portion of said band, and a first MOSFET conductive gate electrode disposed on said first MOSFET gate insulating layer at least laterally over a portion of said first band, such that a first MOSFET device is defined of the enhancement mode type, arranged to establish a channel of N conductivity type extending between said first base region and said first termination region for turning on said switching device when gate voltage is applied;

a second termination region of P conductivity type formed within said cathode region, said second termination region extending to said principal surface and spaced from said second base region such that at said principal surface a gap is defined between said second termination region and said second base region, a second MOSFET depletion mode channel region of P conductivity type formed at said principal surface in said gap so as to fill said gap and connect said second termination region and said second base region;

a second MOSFET gate insulating layer disposed on said principal surface over at least a portion of said second MOSFET depletion mode channel, and a second MOSFET conductive gate electrode disposed on said second MOSFET gate insulating layer at least laterally over a portion of said depletion mode channel region; and an ohmic connection between said second termination region and said cathode region such that, when conducting, the channel of said second MOSFET device electrically connects said switching device cathode and second base regions for turning off said switching device.

6. A MOSFET-gate thyristor device in accordance with claim 5, wherein said second MOSFET depletion mode channel region comprises an ion-implanted region.

7. A MOSFET-gated thyristor in accordance with claim 5, wherein said second termination region is formed within said cathode region.

8. A MOSFET-gated thyristor in accordance with claim 5, wherein said second termination region is formed within said first base region.

9. A MOSFET-gated thyristor in accordance with claim 5, which further comprises an electrical connection between said MOSFET gate electrodes.

10. A MOSFET-gated thyristor in accordance with claim 7, which further comprises an electrical connection between said MOSFET gate electrodes.

11. A MOSFET-gated thyristor in accordance with claim 8, which further comprises an electrical connection between said MOSFET gate electrodes.

12. A MOSFET-gated thyristor integrated device having a single polarity turn-on and turn-off control, said integrated device comprising:

a four-layer semiconductor switching device having a principal surface and including, in order, an anode region layer located farthest from said principal surface and of P conductivity type; a first base region layer of N conductivity type terminating at said principal surface and defining a first PN junction with said anode region layer; a second base region layer of P conductivity type formed within said first base region and defining a second PN junction with said first base region, said second base region being of limited lateral extent and having a periphery terminating at said principal surface; and a cathode region layer of N conductivity type formed within said second base region and defining a third PN junction with said second base region, said cathode region being of limited lateral extend and having a periphery terminating at said principal surface;

a first MOSFET channel surface;

a first termination region of N conductivity type formed within said second base region as an extension of said cathode region, said first termination region extending to said principal surface and spaced from, at the first MOSFET channel surface, said first base region such that at said first MOSFET channel surface a portion of said second base region exists as a band of P conductivity type between said first termination region and said first base region;

a first MOSFET gate insulating layer disposed on said first MOSFET channel surface over at least a portion of said band, and a first MOSFET conductive gate electrode disposed on said first MOSFET gate insulating layer at least over a portion of said first band, such that a first MOSFET device is defined of the enhancement mode type, arranged to establish a channel of N conductivity type extending between said first base region and said first termination region for turning on said switching device when gate voltage is applied;

a second MOSFET channel surface;

a second termination region of P conductivity type formed within said cathode region, said second termination region extending to said principal surface and spaced from said second base region such that at said second MOSFET channel surface a gap is defined between said second termination region and said second base region, a second MOSFET depletion mode channel region of P conductivity type formed at said second MOSFET channel surface in said gap so as to fill said gap and connect said second termination region and said second base region;

a second MOSFET gate insulating layer disposed on said second MOSFET channel surface over at least a portion of said second MOSFET depletion mode channel, and a second MOSFET conductive gate electrode disposed on said second MOSFET gate insulating layer at least over a portion of said depletion mode channel region; and an ohmic connection between said second termination region and said cathode region such that, when conducting, the channel of said second MOSFET device electrically connects said switching device cathode and second base regions for turning off said switching device.

13. A MOSFET-gated thyristor device in accordance with claim 12, wherein said second MOSFET depletion mode channel region comprises an ion-implanted region.

14. A MOSFET-gate thyristor in accordance with claim 8, which further comprises an electrical connection between said MOSFET gate electrodes.

* * * * *